US011659680B2

(12) United States Patent
Lu et al.

(10) Patent No.: US 11,659,680 B2
(45) Date of Patent: May 23, 2023

(54) SUSPENDABLE ASSEMBLY AND TERMINAL DEVICE

(71) Applicant: Fulian Precision Electronics (Tianjin) Co., LTD., Tianjin (CN)

(72) Inventors: Wen-Hu Lu, Tianjin (CN); Li-Yi Yin, Tianjin (CN); Shu-Tong Wang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/711,236

(22) Filed: Apr. 1, 2022

(65) Prior Publication Data
US 2023/0070194 A1   Mar. 9, 2023

(30) Foreign Application Priority Data
Sep. 3, 2021   (CN) .......................... 202122123431.5

(51) Int. Cl.
*H05K 7/14*   (2006.01)
(52) U.S. Cl.
CPC .................. *H05K 7/1489* (2013.01)
(58) Field of Classification Search
None
See application file for complete search history.

(56) References Cited

U.S. PATENT DOCUMENTS

| 6,185,106 | B1* | 2/2001 | Mueller | H05K 7/1409 361/801 |
| 9,795,052 | B2* | 10/2017 | Hsiao | H05K 7/18 |
| 2002/0182896 | A1* | 12/2002 | Welsh | H05K 7/1409 439/1 |
| 2010/0321879 | A1* | 12/2010 | Peng | G11B 33/124 361/679.33 |
| 2013/0241377 | A1* | 9/2013 | Zhang | G06F 1/181 403/188 |
| 2017/0071071 | A1* | 3/2017 | Tseng | H05K 7/1489 |
| 2018/0228045 | A1* | 8/2018 | Yi | E05B 65/44 |

* cited by examiner

*Primary Examiner* — James Wu
*Assistant Examiner* — Christopher L Augustin
(74) *Attorney, Agent, or Firm* — ScienBiziP, P.C.

(57) ABSTRACT

A suspendable assembly for fixing and holding a server includes a housing, a torsion spring, a limiting frame, a handle, and a shaft. The housing includes a first through hole. The torsion spring is fixed on the housing. The limiting frame clamps the torsion spring. The handle is fixed with the limiting frame, the handle comprising a first hook. The shaft penetrates through the housing, the torsion spring, the handle, and the limiting frame. The first hook is configured to engaged with a second hook to limit the suspendable assembly.

14 Claims, 13 Drawing Sheets

US 11,659,680 B2

SUSPENDABLE ASSEMBLY AND TERMINAL DEVICE

FIELD

The subject matter herein generally relates to fixing structures, and more particularly, to a suspendable assembly and a terminal device.

BACKGROUND

Devices are provided and suspended on a chassis to hold a server. Existing devices generally include two portions to fix and hold the server, which is high in cost, difficult to assemble, and poor in stability.

BRIEF DESCRIPTION OF THE DRAWINGS

Implementations of the present technology will now be described, by way of example only, with reference to the attached figures.

DETAILED DESCRIPTION

Figure 1:
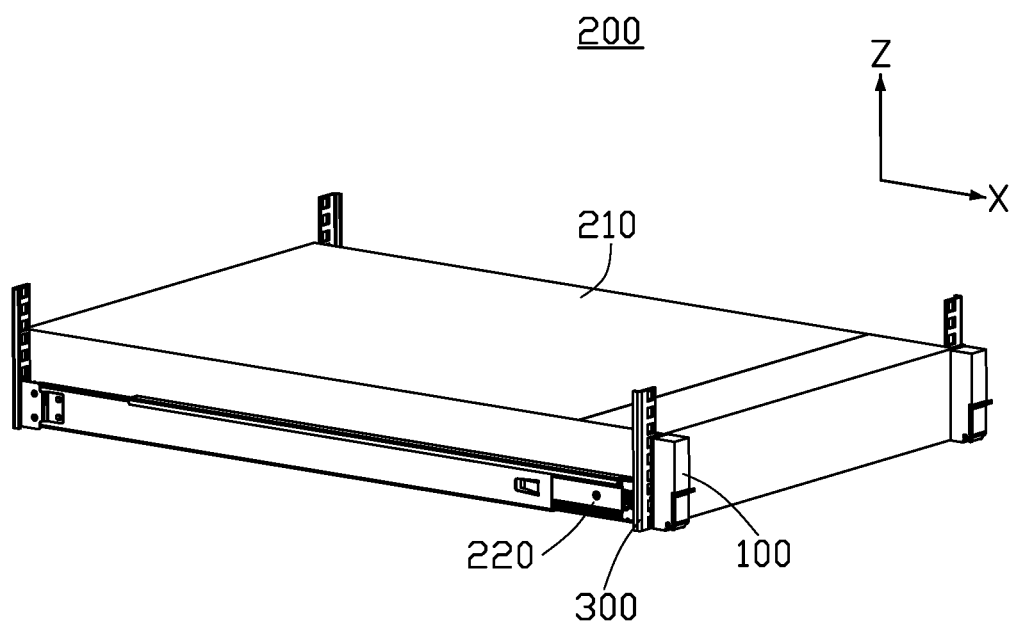
FIG. 1 is a diagrammatic view of an embodiment of a terminal device installed on a bracket according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Figure 2:
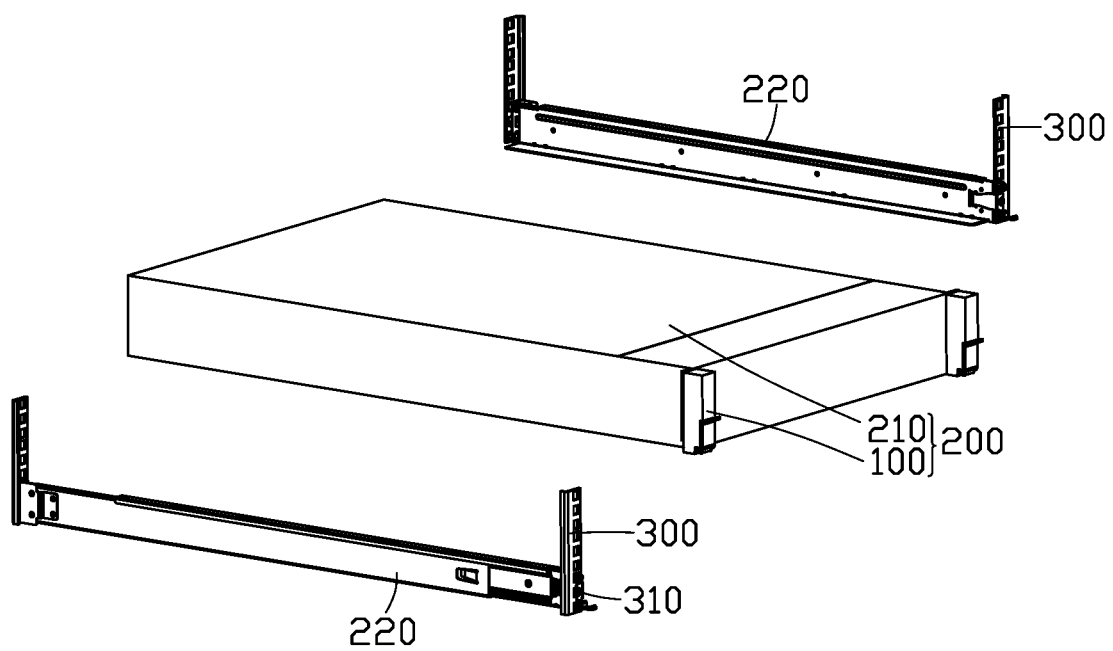
FIG. 2 is an exploded view of the terminal device and the bracket of FIG. 1.

Referring to FIGS. 1 to 2, an embodiment of a terminal device 200 is provided. The terminal device 200 includes a body 210 and a suspendable assembly 100 fixed to the body 210. The terminal device 200 is a product that needs to be fixed on a bracket 300. The terminal device 200 can include, but is not limited to, a server.

A hook member 310 is fixed on the bracket 300. The hook member 310 limits the body 210 along a direction in which the hook member 310 extends. In the embodiment, the hook member 310 extends substantially in a horizontal direction, and the hook member 310 and the suspendable assembly 100 limit the body 210 in the horizontal direction.

The direction in which the hook member 310 extends is defined as the X axis, the direction vertically downward is defined as the Z axis.

Figure 3:
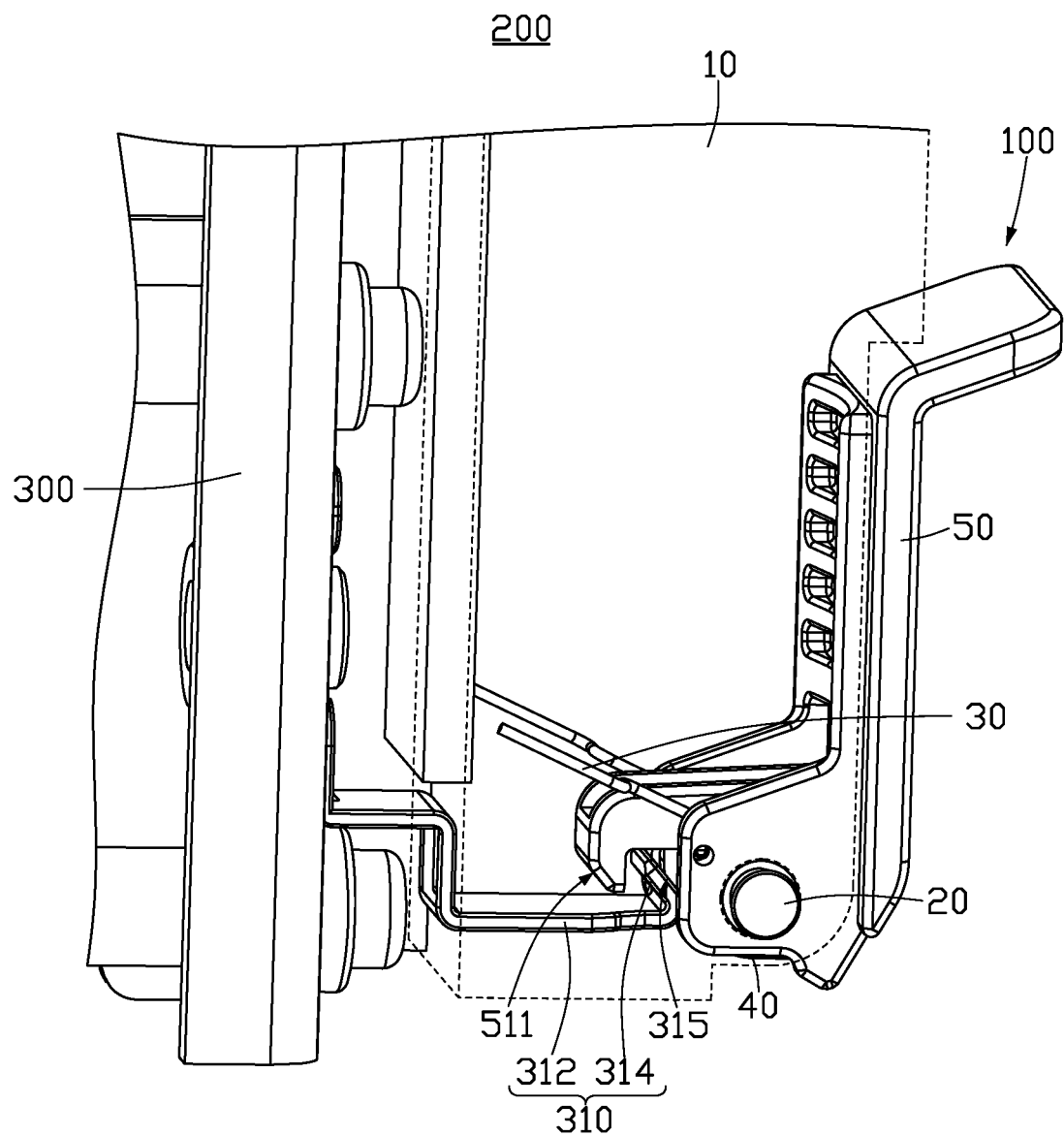
FIG. 3 is an enlarged diagrammatic view of the terminal device of FIG. 1 held by a suspendable assembly.

Referring to FIG. 3, the hook member 310 includes a main body portion 312 and a second hook 314 disposed at one end of the main body portion 312. The second hook 314 includes a first contact surface 315 facing away from the main body portion 312. An angle between the first contact surface 315 and the horizontal direction is an acute angle.

The terminal device 200 further includes a guiding rail 220. The guiding rail 220 is disposed on the body 210. The guiding rail 220 allows the terminal device 200 to move along the X axis direction.

Figure 4:
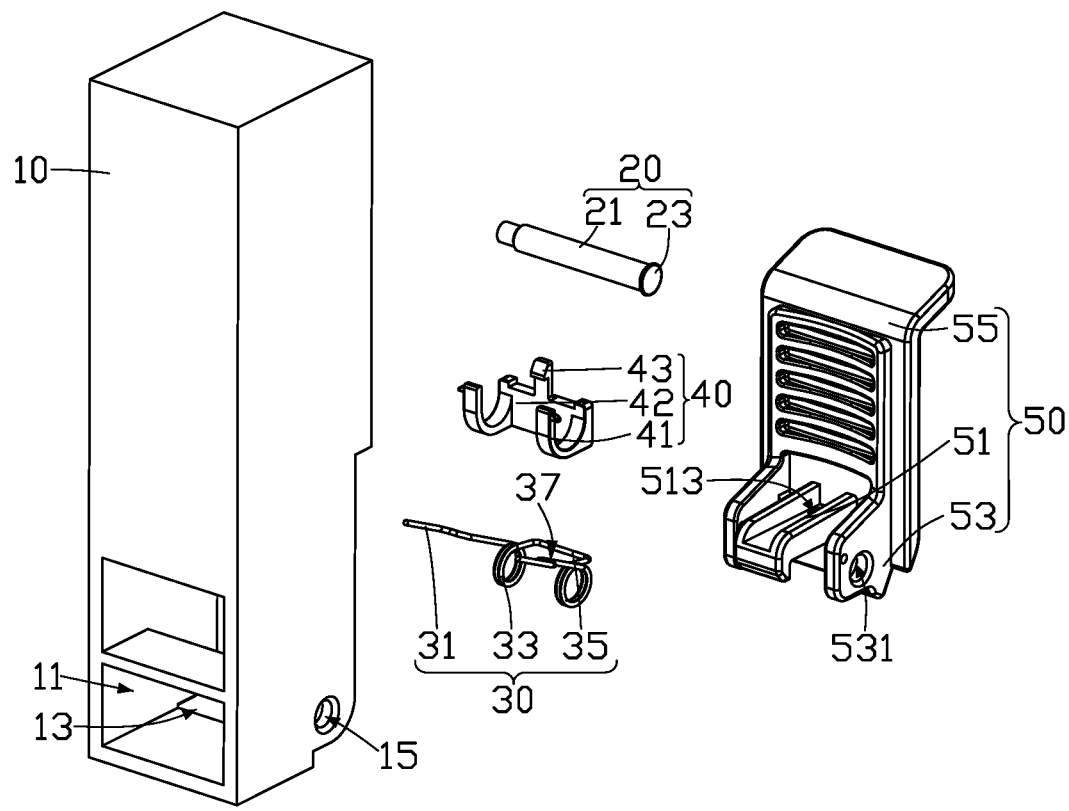
FIG. 4 is an exploded view of the suspendable assembly of FIG. 3.

Referring to FIG. 4, the suspendable assembly 100 includes a housing 10, a shaft 20, a torsion spring 30, a limiting frame 40, and a handle 50. The shaft 20 is movably connected to the housing 10, the torsion spring 30, the limiting frame 40, and the handle 50.

The housing 10 is fixed on the body 210. The housing 10 includes an accommodating groove 11. The accommodating groove 11 accommodates the torsion spring 30, the handle 50, the limiting frame 40, and the shaft 20. The housing 10 further includes a first through hole 13 and a second through hole 15. Each of the first through hole 13 and the second through hole 15 is in communication with the accommodating groove 11. An axial direction of the first through hole 13 is along the X-axis direction, allowing the hook member 310 disposed on the body 210 to pass through, so that the hook member 310 can be disposed in the accommodating groove 11. There are two second through holes 15, and a second through hole 15 is disposed on each side of the first through hole 13. The axial directions of the two second through holes 15 are on the same straight line. The second through holes 15 allow the shaft 20 to pass through the housing 10.

The shaft 20 is substantially rod-shaped. The shaft 20 is rotatably disposed in the two second through holes 15. The shaft 20 includes a rod portion 21 and a convex portion 23 disposed at one end of the rod portion 21. A diameter of the convex portion 23 is larger than a diameter of the second through hole 15, and a diameter of the second through hole 15 is larger than a diameter of the rod portion 21, so that the other end of the rod portion 21 away from the convex portion 23 passes through the second through hole 15. The convex portion 23 is restricted by a peripheral wall forming the second through hole 15. The end of the rod portion 21 away from the convex portion 23 can be fixed by a fixing member (not shown) after the suspendable assembly 100 is assembled, to prevent the shaft 20 from separating from the housing 10.

The torsion spring 30 includes a first fixing portion 31, at least one elastic portion 33, and a blocking portion 35. The first fixing portion 31, the elastic portion 33, and the blocking portion 35 are integrally formed. The elastic portion 33 extends substantially perpendicularly from both ends of the blocking portion 35. The elastic portion 33 extends from both ends of the blocking portion 35, and is substantially perpendicular to the blocking portion 35. In the embodiment, an elastic portion 33 is disposed on each side of the blocking portion 35. The elastic portion 33 is in a coiled shape. A winding direction of the elastic portions 33 are substantially perpendicular to the blocking portion 35. The first fixing portion 31 is formed by extending the elastic portions 33. The first fixing portion 31 is fixed on the housing 10. The first fixing portion 31 and the blocking portion 35 form the two ends of the elastic portions 33. The blocking portion 35 protrudes relative to the two elastic portions 33 to form a space 37. The first fixing portion 31 is disposed on a side of the elastic portions 33 away from the blocking portion 35. The first fixing portion 31 fixes the torsion spring 30 on the housing 10, and the rod portion 21 can pass through the elastic portions 33. The first fixing portion 31 and the blocking portion 35 are disposed on opposite sides of the rod portion 21, a certain space exists between the rod portion 21 and the blocking portion 35. When an external force is applied on the blocking portion 35, the elastic portions 33 are deformed. When the external force is released, the elastic portions 33 rebound and drive the blocking portion 35 back to the initial position.

The limiting frame 40 is detachably fixed to the housing 10. The limiting frame 40 includes at least one limiting portion 41, a connecting portion 42, and a hook portion 43. The connecting portion 42 is substantially a rectangular plate. The limiting portion 41 extends from a surface of the connecting portion 42 and is substantially U-shaped. The hook portion 43 extends from a side surface of the connecting portion 42. A number of the limiting portion(s) 41 is the same as a number of the elastic portion(s) 33. In the embodiment, a limiting portion 41 is disposed on each side of the hook portion 43. The U-shaped limiting portions 41 are sleeved on the periphery of the elastic portions 33 for limiting the elastic portions 33 during the assembly of the suspendable assembly 100. The hook portion 43 passes through the space 37 between the elastic portions 33 and the blocking portion 35.

The handle 50 includes a first hook 51, two second fixing portions 53, and a handle portion 55. The first hook 51, the second fixing portions 53, and the handle portion 55 are fixed together. The first hook 51 and the two second fixing portions 53 are disposed on the same side of the handle portion 55. The first hook 51 and the two second fixing portions 53 are both disposed in the accommodating groove 11. The first hook 51 is engaged with the second hook 314 to fix and hold the terminal device 200. A side of the first hook 51 facing away from the handle portion 55 has a second contact surface 511. The second contact surface 511 and the first contact surface 315 extend along the same direction, and each of the second contact surface 511 and the first contact surface 315 forms an acute angle with the horizontal direction. When the second hook 314 and the first hook 51 are in contact with each other, the first contact surface 315 and the second contact surface 511 are also in contact with each other. When the external force remains acting on the second hook 314 and the first hook 51, the first contact surface 315 and the second contact surface 511 translate the external force into a force along the X-axis direction and another force along the Z-axis direction. In some embodiments, the angle between the first contact surface 315 and the horizontal direction is the same as the angle between the second contact surface 511 and the horizontal direction, so that the first contact surface 315 and the second contact surface 511 are in surface contact, and the interaction therebetween is more uniform. The second fixing portion 53 includes a third through hole 531, and the third through hole 531 corresponds to the second through hole 15, so that the shaft 20 can pass through the second through hole 15 and the third through hole 531. The second fixing portion 53 includes a fourth through hole 513, and the hook portion 43 passes through the fourth through hole 513, so that the handle 50 and the limiting frame 40 can move synchronously. The handle portion 55 is disposed on an exterior surface of the suspendable assembly 100, and external forces can be applied on the handle portion 55 to rotate the first hook 51, thus the first hook 51 will be no longer limited by the second hook 314.

A process of assembling the suspendable assembly 100 provided will be described as follows.

Figure 5:
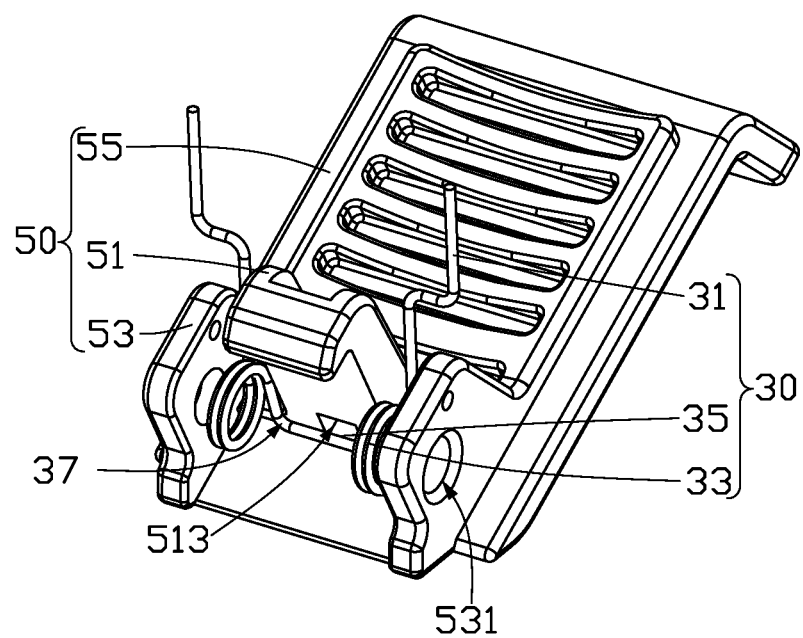
FIG. 5 is diagrammatic view showing a torsion spring and a handle which are assembled.

In block S11: referring to FIG. 5, the torsion spring 30 and the handle 50 are assembled. The torsion spring 30 is disposed between the two second fixing portions 53 of the handle 50. The first fixing portion 31 protrudes from the handle 50. The elastic portions 33 and the blocking portion 35 are disposed on the same side of the first hook 51.

Figure 6:
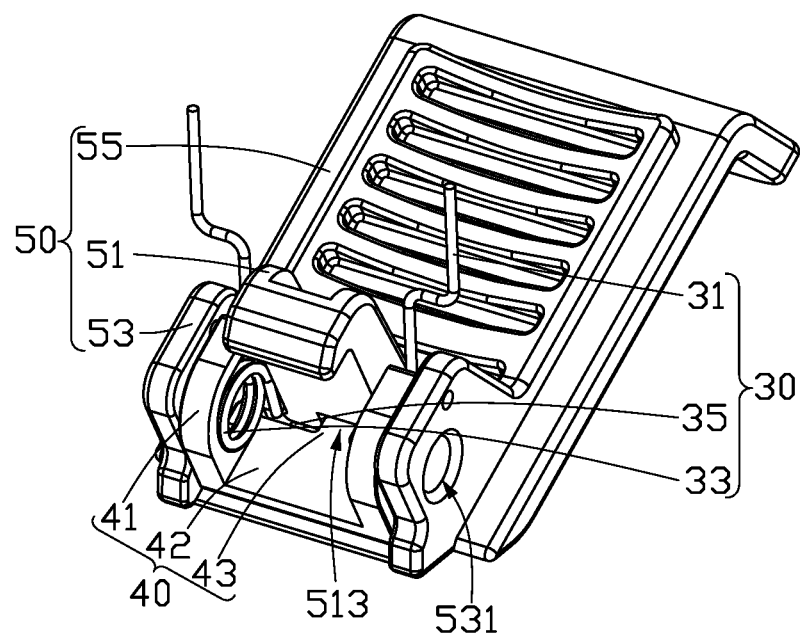
FIG. 6 is diagrammatic view showing a limiting frame assembled to the structure of FIG. 5.

In block S12: referring to FIG. 6, the limiting frame 40 is assembled. The hook portion 43 of the limiting frame 40 is inserted through the fourth through hole 513, and the blocking portion 35 is disposed between the hook portion 43 and the handle portion 55, the hook portion 43 abutting against the blocking portion 35. The elastic portions 33 are clamped within the limiting portions 41 of the limiting frame 40. Since the torsion spring 30 has a certain elasticity, a shape of the torsion spring 30 needs to be changed before and after the assembly. The elastic portions 33 are restricted by the U-shaped limiting portions 41, and the hook portion 43 is held against the blocking portion 35, and the torsion spring 30 is pre-deformed, so that the elastic portions 33 correspond to a position of the third through hole 531, so that the shaft 20 can pass through the third through hole 531 and the elastic portions 33.

Figure 7:
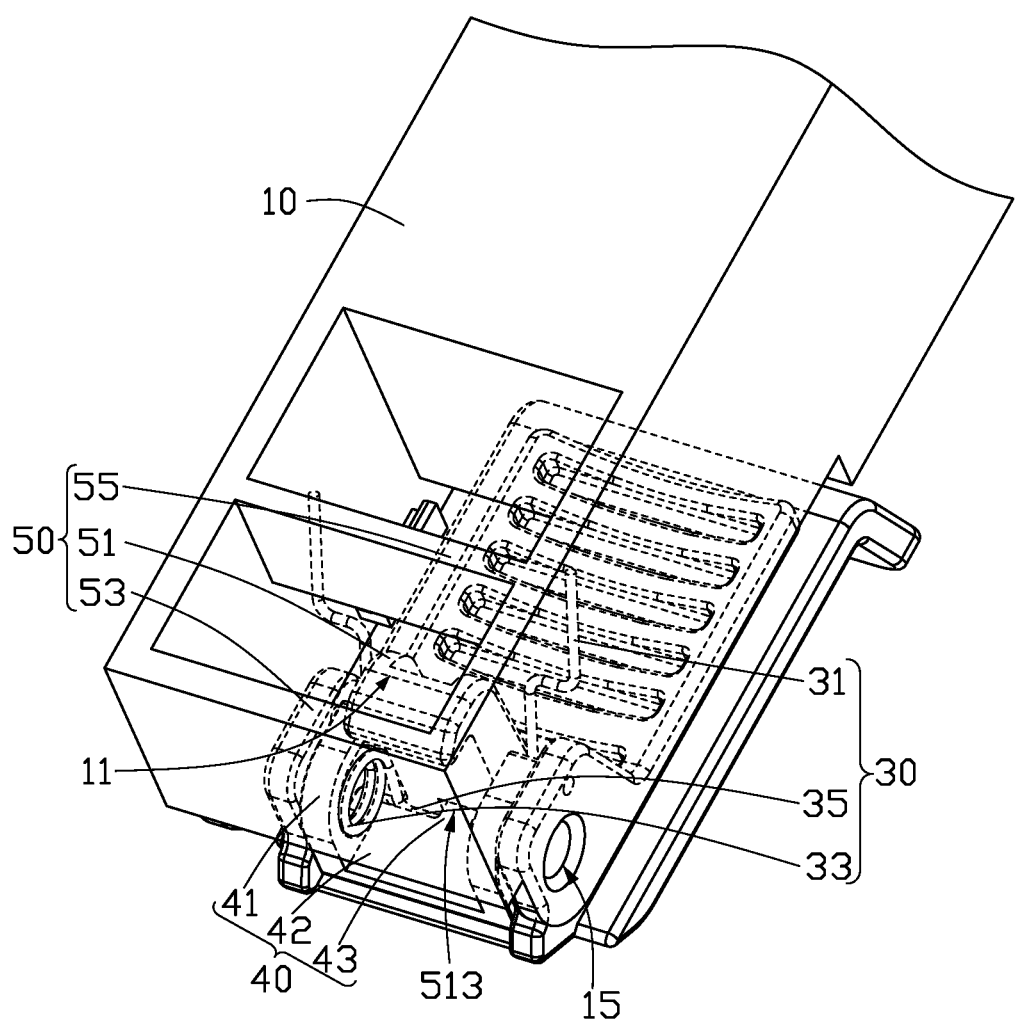
FIG. 7 is diagrammatic view showing a housing assembled to the structure of FIG. 6.

In block S13: referring to FIG. 7, the housing 10 is assembled. A part of the structure assembled in block S12 is disposed in the accommodating groove 11 of the housing 10. The handle portion 55 is disposed outside the accommodating groove 11. The third through hole 531 and the elastic portions 33 are disposed to correspond to the second through hole 15 of the housing 10.

Figure 8:
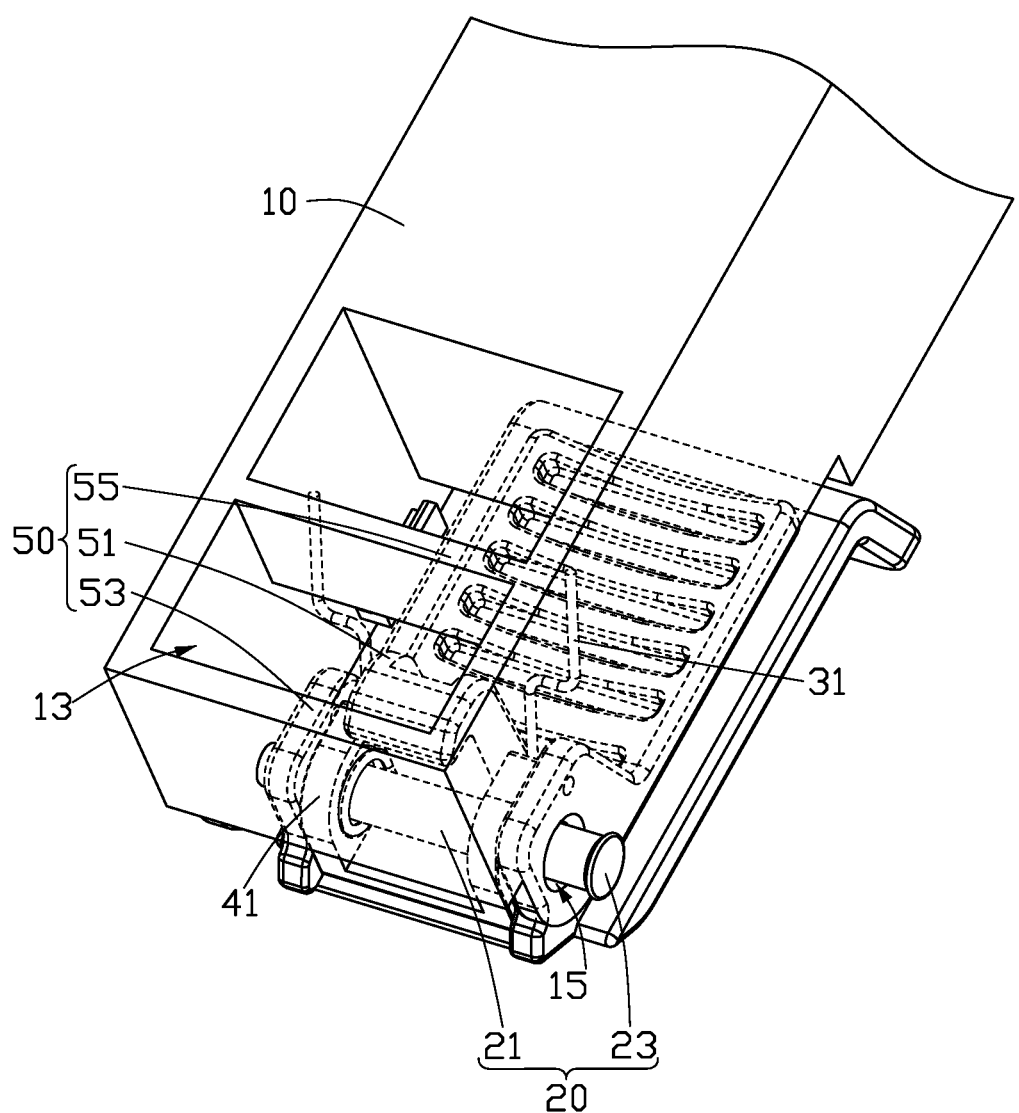
FIG. 8 is diagrammatic view showing a suspendable assembly after assembling a shaft on the structure of FIG. 7.

In block S14: referring to FIG. 8, the shaft 20 is assembled. From the outside, the shaft 20 passes through the second through hole 15, the third through hole 531, and the elastic portions 33, and passes through the second through hole 15 on the other side of the housing 10, to connect the housing 10, the torsion spring 30, the handle 50, and the limiting frame 40 into a whole.

The following describes in detail the mutual engagement process of the terminal device 200 with the suspendable assembly 100 and the bracket 300 with the hook member 310 provided in the embodiment.

Figure 9:
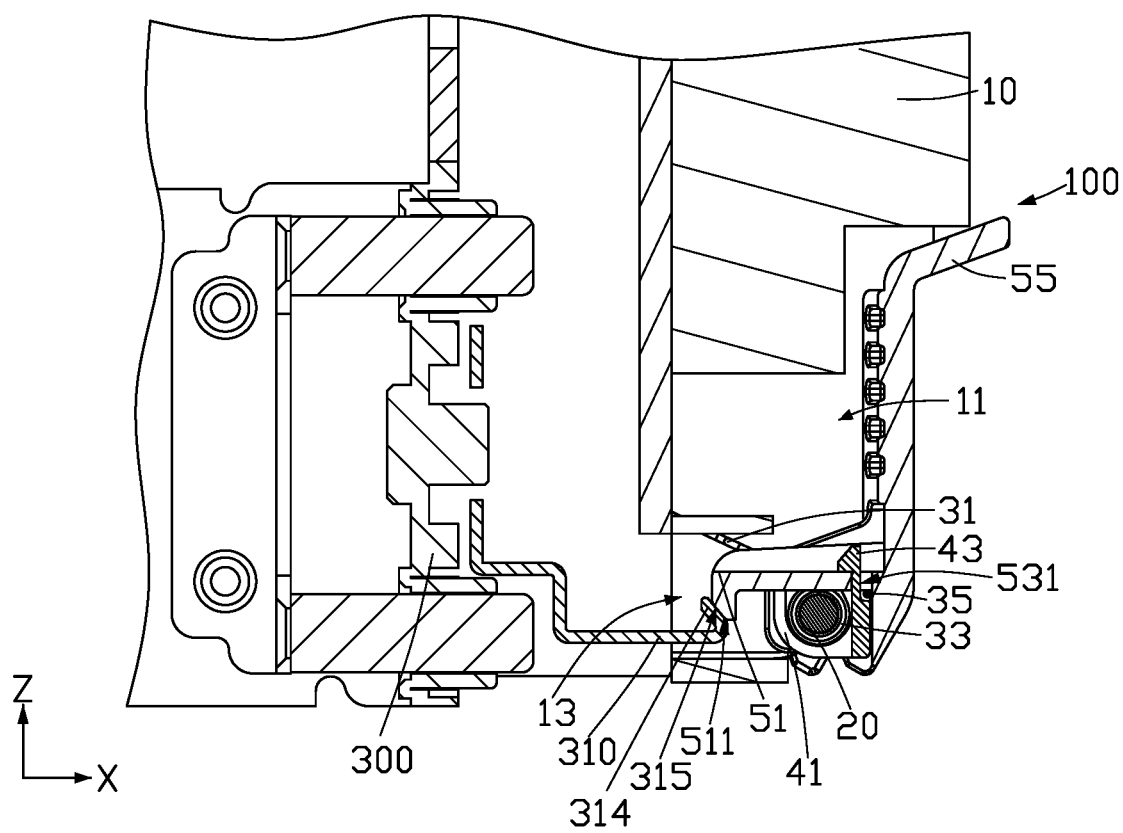
FIG. 9 is cross-sectional view of the suspendable assembly when the assembly is not clamped with a second hook.

In block S21: referring to FIG. 9, the bracket 300 is fixed, and an external force is applied on the terminal device 200. The terminal device 200 with the suspendable assembly 100 moves along the X-axis direction with the guiding rail 220, so that the hook member 310 passes through the first through hole 13 and contacts and abuts the first hook 51. The first contact surface 315 is thus in contact with the second contact surface 511.

Figure 10:
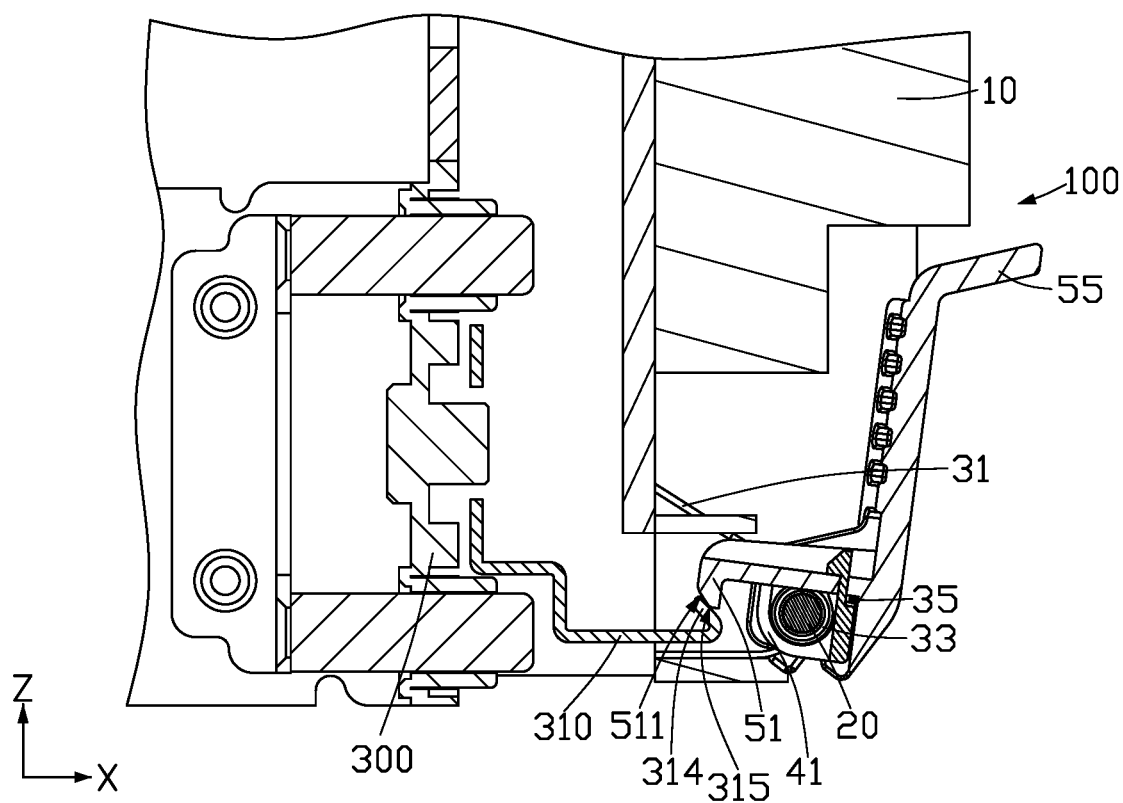
FIG. 10 is cross-sectional view of a first hook of the suspendable assembly shown in FIG. 9 ready to be separated from the second hook, after moving along a Z-axis direction.

In block S22: referring to FIG. 10, the external force remains to act on the terminal device 200, the first hook 51 further acting on the second hook 314. Since the first contact surface 315 and the second contact surface 511 have acute angles in the same direction, the first hook 51 has a tendency to move along the Z-axis direction. The first hook 51 rotates around the shaft 20 and deforms the torsion spring 30 until a critical point at which the first hook 51 and the second hook 314 are ready to be separated.

Figure 11:
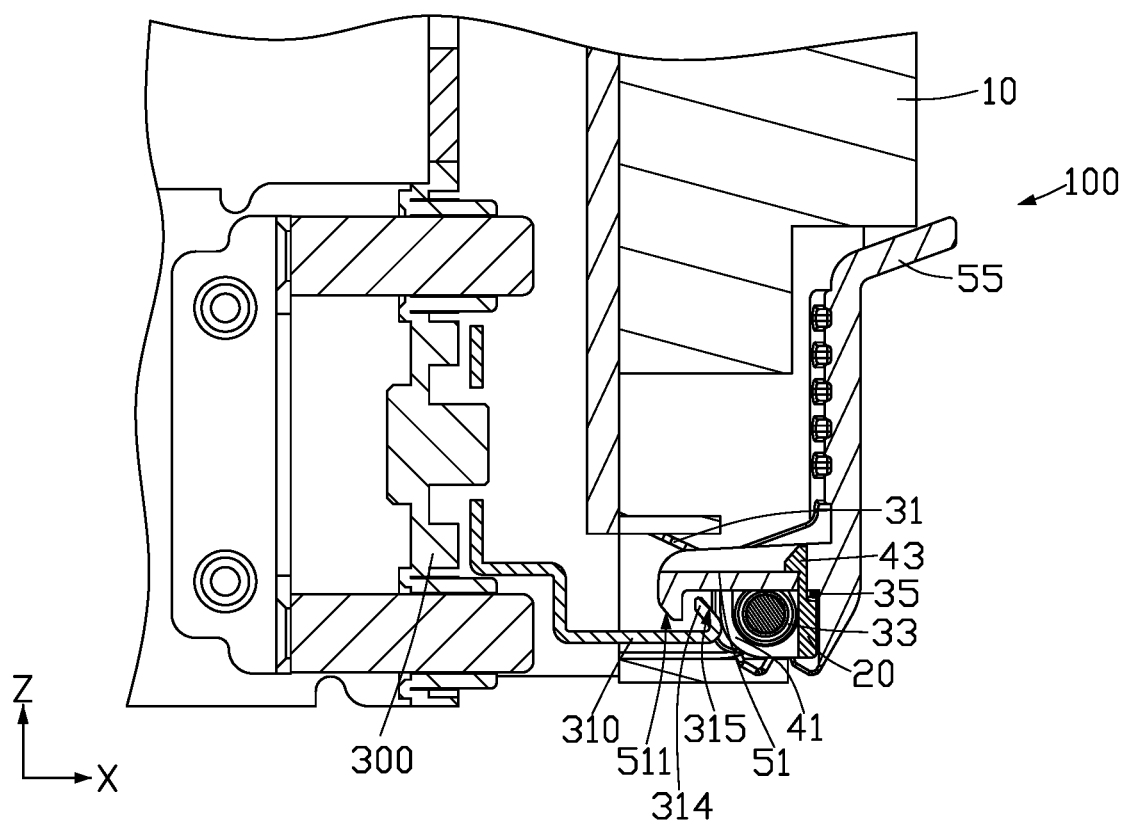
FIG. 11 is cross-sectional view showing the suspendable assembly and the second hook clamped with each other.

In block S23: referring to FIG. 11, the external force remains to act on the terminal device 200, beyond the critical point at which the first hook 51 is separated from the second hook 314, the first hook 51 loses the force of the second hook 314. At this time, the torsion spring 30 recovers as it loses the force of the first hook 51, the torsion spring 30 recovers of its own elasticity, and the first hook 51 and the second hook 314 are thereby locked with each other.

The following describes in detail the process of releasing the clamping effect of the suspendable assembly 100 provided in the embodiment.

Figure 12:
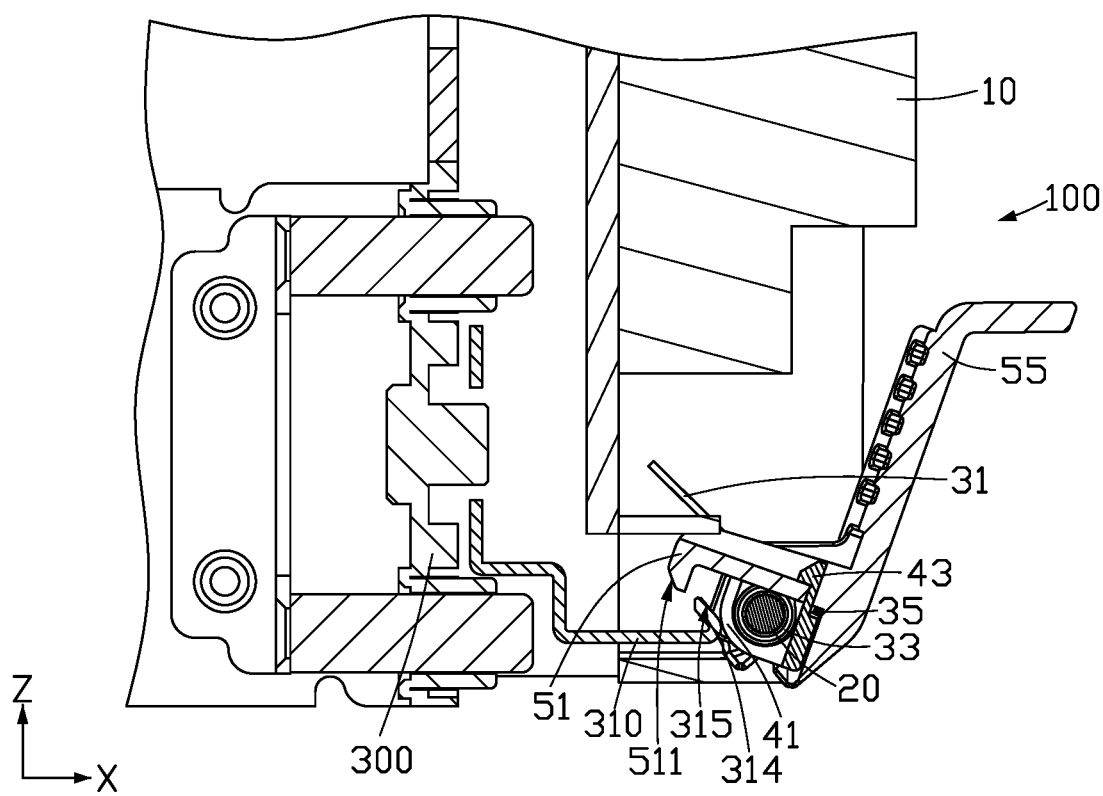
FIG. 12 is cross-sectional view showing the handle being rotated around the shaft, after an external force is applied to the handle.

In block S31: referring to FIG. 12, an external force is applied on the handle portion 55. The handle portion 55 rotates around the shaft 20. The first hook 51 fixed on the handle portion 55 rotates with the handle portion 55 and reaches the critical point where the second hook 314 is separated therefrom. At this time, the hook portion 43 inserted through the fourth through hole 513 rotates synchronously with the handle portion 55. The rotation of the hook portion 43 causes the blocking portion 35 abutting the hook portion 43 to move, so that the elastic portions 33 of the torsion spring 30 are deformed.

Figure 13:
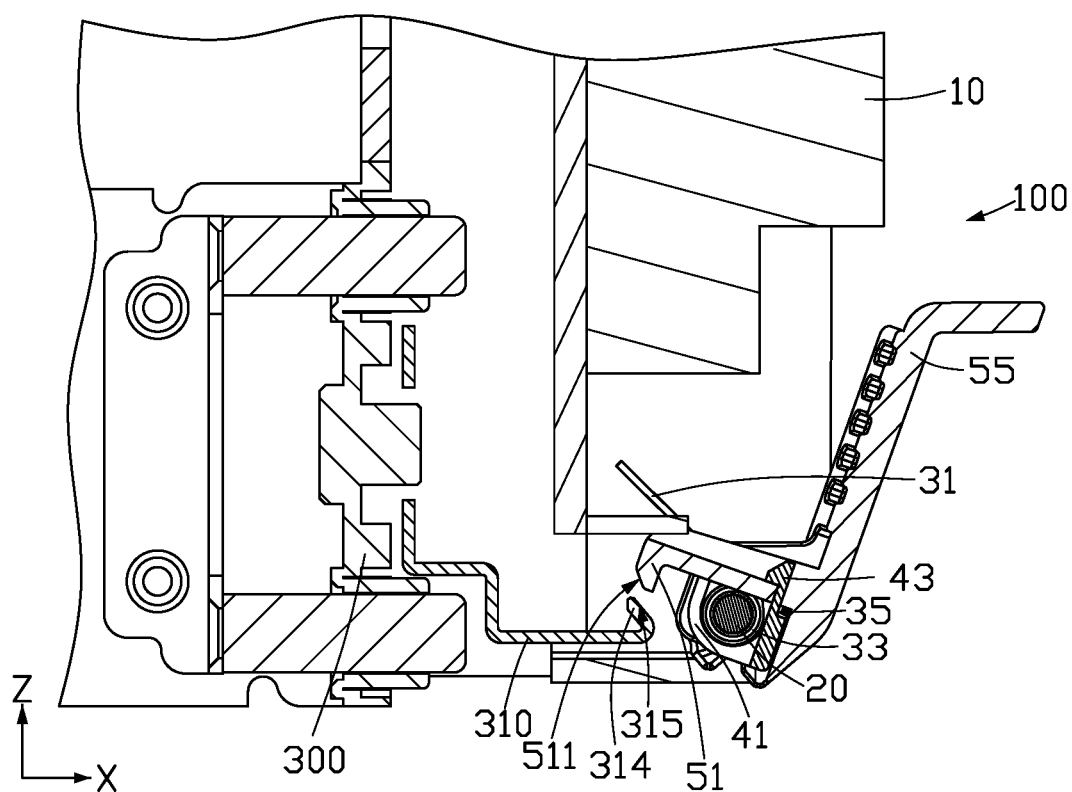
FIG. 13 is cross-sectional view of the terminal device moved by the external force along an X-axis direction.

In block S32: referring to FIG. 13, the external force remains act on the handle portion 55, the first hook 51 and the second hook 314 are separated from each other, and the terminal device 200 is pulled out along the X-axis direction.

In block S33: the external force acting on the handle portion 55 is removed, and the elastic portions 33 recover from being deformed under their own elasticity. During the process of undeforming, the blocking portion 35 drives the hook portion 43 to rotate, and the rotation of the hook portion 43 drives the handle 50 fixed to the limiting frame 40 to rotate so that the handle 50 returns to the initial position (referring to FIG. 9 again).

The terminal device 200 includes the suspendable assembly 100 provided in the present disclosure. By applying a small external force, the second hook 314 can be engaged with the first hook 51 to confine the terminal device 200 on the bracket 300. At the same time, under the action of the torsion spring 30, the suspendable assembly 100 returns to original state. When it is necessary to release the interaction between the suspendable assembly 100 and the bracket 300, a force is applied on the handle 50. Before such force is applied to the handle 50, the suspendable assembly 100 stably limits the terminal device 200 and the hook member 310. The suspendable assembly 100 and the hook member 310 fix and hold the terminal device 200 with high stability. The suspendable assembly 100 includes the limiting frame 40, and the pre-deformed torsion spring 30 is already limited, so that the suspendable assembly 100 is simple to install, saves manpower, and reduces the cost.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A suspendable assembly comprising:
a housing comprising a first through hole;
a torsion spring comprising a first fixing portion, an elastic portion, and a blocking portion, the first fixing portion fixed on the housing, the elastic portion extending from the blocking portion, and disposed on both sides of the blocking portion, and the blocking portion protruding relative to the elastic portion;
a limiting frame comprising a limiting portion and a hook portion, the elastic portion clamped within the limiting portion, and the hook portion disposed in a space formed by the blocking portion and the elastic portion;
a handle fixed with the limiting frame, the handle comprising a first hook; and
a shaft penetrating through the housing, the torsion spring, the handle, and the limiting frame;
wherein the first hook is configured to be engaged with a second hook to limit the suspendable assembly.

2. The suspendable assembly of claim 1, wherein the housing comprises an accommodating groove and a second through hole, each of the first through hole and the second through hole is in communication with the accommodating groove; the torsion spring, the limiting frame, the handle, and the rotating shaft are accommodated in the accommodating groove.

3. The suspendable assembly of claim 1, wherein the limiting portion is U-shaped.

4. The suspendable assembly of claim 1, wherein the handle further comprises a second fixing portion and a handle portion; the second fixing portion, the handle portion, and the first hook are fixed together, the first hook and the second fixing portion are disposed on a same side of the handle; the second fixing portion comprises a third through hole, and the shaft passes through the third through hole.

5. The suspendable assembly of claim 4, wherein the second fixing portion comprised a fourth through hole, the hook portion passes through the fourth through hole, and the blocking portion is disposed between the hook portion and the handle portion.

6. The suspendable assembly of claim 1, wherein the shaft comprises a rod portion and a convex portion disposed at one end of the rod portion, the rod portion is disposed in the housing, the torsion spring, the handle, and the limiting frame; the convex portion is disposed on one side of the housing.

7. A terminal device, comprising:
a body;
a suspendable assembly comprising:
a housing comprising a first through hole;
a torsion spring comprising a first fixing portion, an elastic portion, and a blocking portion, the first fixing portion fixed on the housing, the elastic portion extending from the blocking portion, and disposed on both sides of the blocking portion, and the blocking portion protruding relative to the elastic portion;
a limiting frame comprising a limiting portion and a hook portion, the elastic portion clamped within the limiting portion, and the hook portion disposed in a space formed by the blocking portion and the elastic portion;

a handle fixed with the limiting frame, the handle comprising a first hook; and a shaft penetrating through the housing, the torsion spring, the handle, and the limiting frame;

wherein the first hook is configured to be engaged with a second hook to limit the suspendable assembly.

8. The terminal device of claim 7, wherein the housing comprises an accommodating groove and a second through hole, each of the first through hole and the second through hole is in communication with the accommodating groove; the torsion spring, the limiting frame, the handle, and the rotating shaft are accommodated in the accommodating groove.

9. The terminal device of claim 7, wherein the limiting portion is U-shaped.

10. The terminal device of claim 7, wherein the handle further comprises a second fixing portion and a handle portion; the second fixing portion, the handle portion, and the first hook are fixed together, the first hook and the second fixing portion are disposed on a same side of the handle; the second fixing portion comprises a third through hole, and the shaft passes through the third through hole.

11. The terminal device of claim 10, wherein the second fixing portion comprised a fourth through hole, the hook portion passes through the fourth through hole, and the blocking portion is disposed between the hook portion and the handle portion.

12. The terminal device of claim 7, wherein the shaft comprises a rod portion and a convex portion disposed at one end of the rod portion, the rod portion is disposed in the housing, the torsion spring, the handle, and the limiting frame; the convex portion is disposed on one side of the housing.

13. The terminal device of claim 7, wherein the terminal device further comprises a guiding rail connected to the body.

14. The terminal device of claim 7, wherein the terminal device is a server.

* * * * *